(12) United States Patent
Bockorick et al.

(10) Patent No.: US 7,651,882 B1
(45) Date of Patent: Jan. 26, 2010

(54) RFID TAG CIRCUIT DIE WITH SHIELDING LAYER TO CONTROL I/O BUMP FLOW

(75) Inventors: Cameron Bockorick, Seattle, WA (US); Ronald E. Paulsen, Woodinville, WA (US); Andrew E. Horch, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 265 days.

(21) Appl. No.: 11/891,391

(22) Filed: Aug. 9, 2007

(51) Int. Cl.
*H01L 21/20* (2006.01)

(52) U.S. Cl. .................... 438/64; 438/108; 438/119; 438/460; 438/464; 438/465; 257/E21.508; 257/E21.511; 257/E21.632; 257/E21.705; 257/E23.064; 257/E27.062; 257/E27.112; 257/E29.022

(58) Field of Classification Search .............. 438/64, 438/108, 114, 119, 460, 464, 465; 257/E21.508, 257/511, 705, E23.064, E27.062, 112, E29.022
See application file for complete search history.

(56) References Cited

U.S. PATENT DOCUMENTS

| | | | | |
|---|---|---|---|---|
| 6,100,804 A | * | 8/2000 | Brady et al. | 340/572.7 |
| 6,424,263 B1 | * | 7/2002 | Lee et al. | 340/572.7 |
| 7,185,823 B2 | * | 3/2007 | Inoue et al. | 235/492 |
| 7,199,718 B2 | * | 4/2007 | Kikuchi et al. | 340/572.8 |
| 7,298,265 B2 | * | 11/2007 | Ishikawa et al. | 340/572.1 |
| 7,353,598 B2 | * | 4/2008 | Craig et al. | 29/846 |
| 7,363,704 B2 | * | 4/2008 | Kobayashi et al. | 29/832 |
| 7,482,251 B1 | * | 1/2009 | Paulsen et al. | 438/460 |
| 7,500,610 B1 | * | 3/2009 | Hadley et al. | 235/451 |
| 2006/0057763 A1 | * | 3/2006 | Teo et al. | 438/64 |
| 2006/0086805 A1 | * | 4/2006 | Oozeki et al. | 235/492 |
| 2009/0195289 A1 | * | 8/2009 | Subramanian et al. | 327/328 |
| 2009/0199966 A1 | * | 8/2009 | Coleman et al. | 156/344 |

* cited by examiner

*Primary Examiner*—Michael S Lebentritt
(74) *Attorney, Agent, or Firm*—Turk IP Law, LLC

(57) ABSTRACT

The present description describes back-end processes, the use of which may help overcome these problems and limitations of the prior art. In one optional embodiment, the back-end process includes depositing a layer over a wafer. The wafer contains a plurality of circuit die for respective RFID tags. The wafer also has exposed metallic regions. The exposed metallic regions include first regions having electrical contacts to the plurality of circuit die and second regions having electrical contacts to the wafer's electrical test sites. The method includes forming exposed first regions and unexposed second regions by etching the layer over the first regions but not over the second regions. The method also includes plating metallic bumps on the exposed first regions.

32 Claims, 14 Drawing Sheets

*AFTER PARTIAL SAWING*

WITH ATTACHED ANTENNA INLAY

RFID TAG CIRCUIT DIE WITH SHIELDING LAYER TO CONTROL I/O BUMP FLOW

BACKGROUND

1. Field of the Invention

The present description is related to the field of electric circuitry, and more specifically to an RFID tag circuit die with an additional file to control I/O bump flow.

2. Description of the Related Art

FIGS. 1A, 1B and 1C are snapshots of steps in methods for preparing integrated circuit chips from a silicon wafer according to embodiments.

Integrated circuits are made according to embodiments, using semiconductor fabrication methods. A quick overview of these methods is now described.

FIG. 1A shows a starting wafer 191. Wafer 191 is typically of semiconductor material, such as silicon. The silicon is sometimes doped with p-type or n-type impurities, to improve its electronic properties as desired. Wafer 191 has an original surface 192, at which circuits are formed as described below.

FIG. 1B shows a wafer 194, which is derived from wafer 192 after circuits 195 have been formed according to embodiments. Circuits 195 are formed by semiconductor manufacturing machines, often operated by foundries. It is worthwhile to note that circuits 194 are formed at surface 192, both beneath its original level and above it. Accordingly, wafer 194 has a new surface, which is elevated compared to original surface 192.

FIG. 1C shows that wafer 194 of FIG. 1B is afterwards separated into chips 197, 198, 199. Separation can happen by dicing wafer 194, or etching it, etc. Each of chips 197, 198, 199 typically contains one of circuits 195, and is thus called an integrated circuit (IC) chip or "circuit die". The size of each IC chip is thus determined in part by the size of circuit 195.

FIGS. 2A through 2E demonstrate a particular problem with the state of the art of manufacturing circuit die for use in RFID tags. FIG. 2A shows a cross section of a completed wafer before it has been diced into multiple individual circuit die. FIG. 2A shows the wafer substrate 201 and the overlying layers 205 of wiring metallurgy and dielectric insulation. At the top of the processed wafer are bump pads 202a,b and test pad 203.

Bump pads 202a,b are "I/O" pads meaning they are used to support later manufactured "bumps" or "contacts" that supply electrical signals to and/or from the semiconductor die of which they are a part. As will be seen, pad 202a and pad 202b belong to two separate die (that is, pad 202a belongs to a first die and pad 202b belongs to second die). As will be observed further below, the bumps that are later formed on the I/O pads on an RFID tag circuit die are typically connected to an antenna assembly after the die has been separated from the wafer.

Also observed on the surface of the wafer is a test pad 203. The test pad is a form of I/O used by the wafer processing manufacturer (e.g., a foundry) to test the quality of the structures within wiring layer 205 and/or the quality of the transistors that are embedded within the substrate 201. Here, test structures, called test sites, are purposely created within the wiring layer 205 and the substrate 201 and pad 203 (among other pads like pad 203) are electrically to respective one or more test site(s). As will be seen, the wafer is cut into individual die by sawing through a region of the wafer at or near to the test pad 203.

The depiction of FIG. 2A shows the wafer after the wafer is near completion. Here, note that the pads 202a, 202b and 203 can be viewed as being "exposed" through a layer of passivation 204a, 204b, 204c, 204d. During the final stages of wafer processing, referred to as "back-end" processing, after the pads 202a, 202b, 203 are formed, a layer of passivation is coated over the wafer thereby covering the pads 202a, 202b, 203. The passivation layer is subsequently patterned such that openings in the passivation layer are formed directly above the pads 202a, 202b, 203 thereby exposing them.

FIG. 2B shows the beginning of the process of separating the wafer into individual die. According to the specific depiction of FIG. 2B, the wafer is sawed along a saw street 211 which, according to the particular depiction observed, is along the wafer test pad 203. The particular depiction observed also indicates that the wafer is not completely sawed through.

FIG. 2C next shows the formation of the aforementioned I/O bumps 206a, 206b. According to one process, the bumps 206a, 206b are made substantially of Nickel (Ni) and Gold (Au), e.g., $Ni_xAu_{x-1}$, and are deposited by a plating process such as electroplating. According to other processes the bumps 206a, 206b may be made substantially of Au or Palladium (Pd) or solder. In a plating processing, the bumps are deposited on their respective bump pads by activating one or more chemical reactions between the exposed pads 202a, 202b and a liquid solution that is applied to the surface of the wafer. Depositing bumps in this fashion is well known in the art.

The liquid solution used to form the bumps, however, substantially wets the entire surface of the wafer causing chemical reaction at regions of the wafer other than the exposed pads 202a, 202b. Because the solution is designed to react with the metal of the bump pads 206a, 206b to form the bumps, other exposed metallic regions are apt to promote the deposition of bump material. Because the metallurgy associated with the wafer test pad 203 and the wiring layer 205 of the wafer may include metal that is the same as or similar to the metal of the bumps pads 202a, 202b, these regions tend to promote the formation of unwanted bump material 206c, 206d. Note that if the wafer is not sawed at all the test pad 203 by itself can support the formation of unwanted bump material.

FIG. 2D shows the next step in the process which entails the separation of the wafer into individual die. This can be done either by continuing the sawing or by "back-grinding" the back of the wafer until the surface of back of the wafer meets the end of the sawed to depth.

FIG. 2E shows a problem that is particularly acute with respect to RFID circuit die. According to the depiction of FIG. 2E, when the antenna assembly is attached to the circuit die, the antenna inlay 208a makes electrical contact ("shorts" 266) not only with the bump 206a (where electrical contact is supposed to be made) but also with the unwanted bump material. The antenna receives high frequency signals. Electrical channels that process the received high frequency signals are usually designed with an "impedance" that is precisely attuned to diminish the ill-effects of signal attenuation and/or reflections along the channel.

The impedance of an electrical channel is typically affected by the capacitances, inductances and/or resistances associated with the channel. Here, the contact between the inlay 208a and the unwanted bump material adversely affects these features of the channel such that the impedance of the channel deviates from its designed-for value. The result is a marginally operable or inoperable RFID tag.

BRIEF SUMMARY

The present description describes back-end processes, the use of which may help overcome these problems and limitations of the prior art. In one optional embodiment, the back-end process includes depositing a layer over a wafer. The wafer contains a plurality of circuit die for respective RFID tags. The wafer also has exposed metallic regions. The exposed metallic regions include first regions having electrical contacts to the plurality of circuit die and second regions having electrical contacts to the wafer's electrical test sites. The method includes forming exposed first regions and unexposed second regions by etching the layer over the first regions but not over the second regions. The method also includes plating metallic bumps on the exposed first regions.

Advantages over the prior art may include improving RFID tag yield through the elimination of unwanted contact bump metal and associated effects; reduction of photosensitivity RFID tag circuit die; reduction of thermal stress applied to the die during while the die is being packaged; reduction of parasitic capacitance through dielectric constant reduction; enhanced adhesion between antenna and die; improved packaging yield through die stress buffering relief.

These and other features and advantages of this description will become more readily apparent from the following Detailed Description, which proceeds with reference to the drawings.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
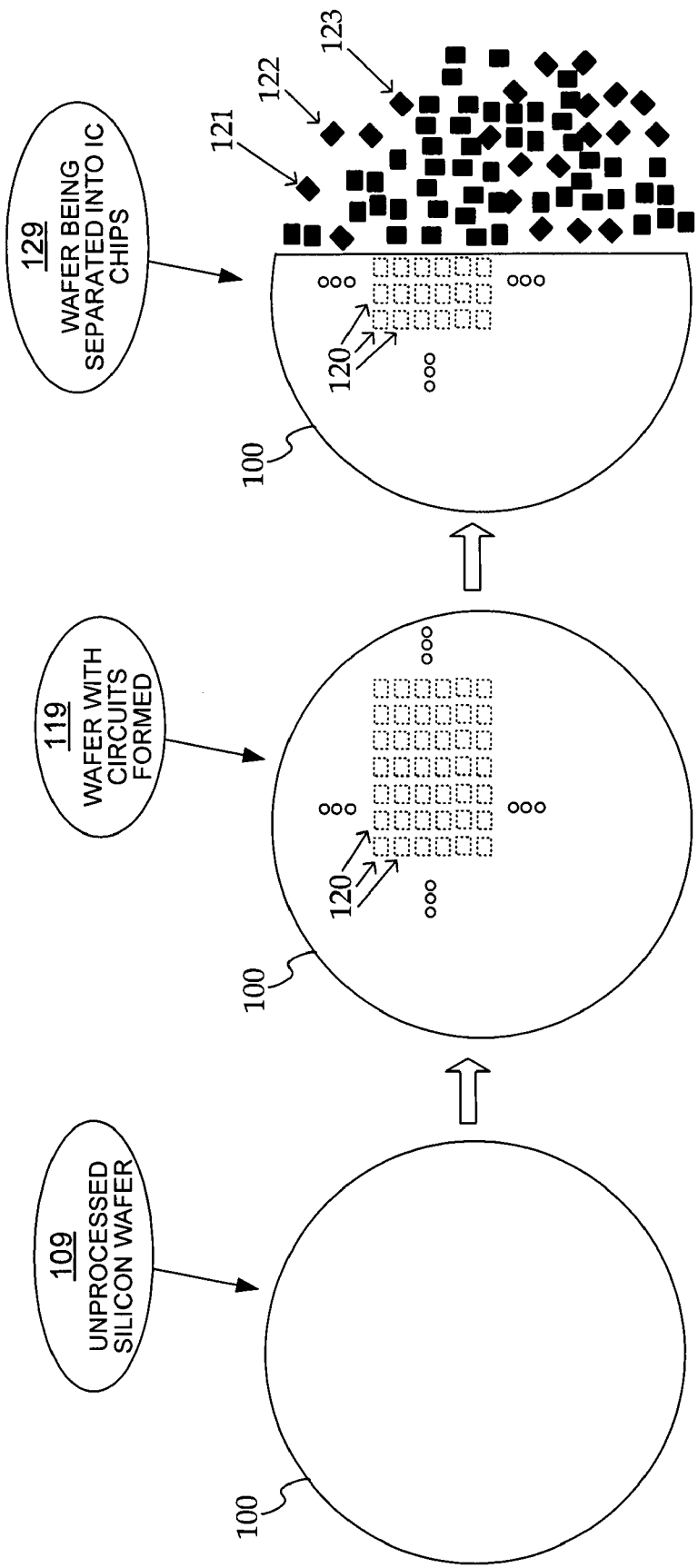
FIG. 1 shows how RFID tag integrated circuits can be made from a silicon wafer according to embodiments.
Figure 2A:
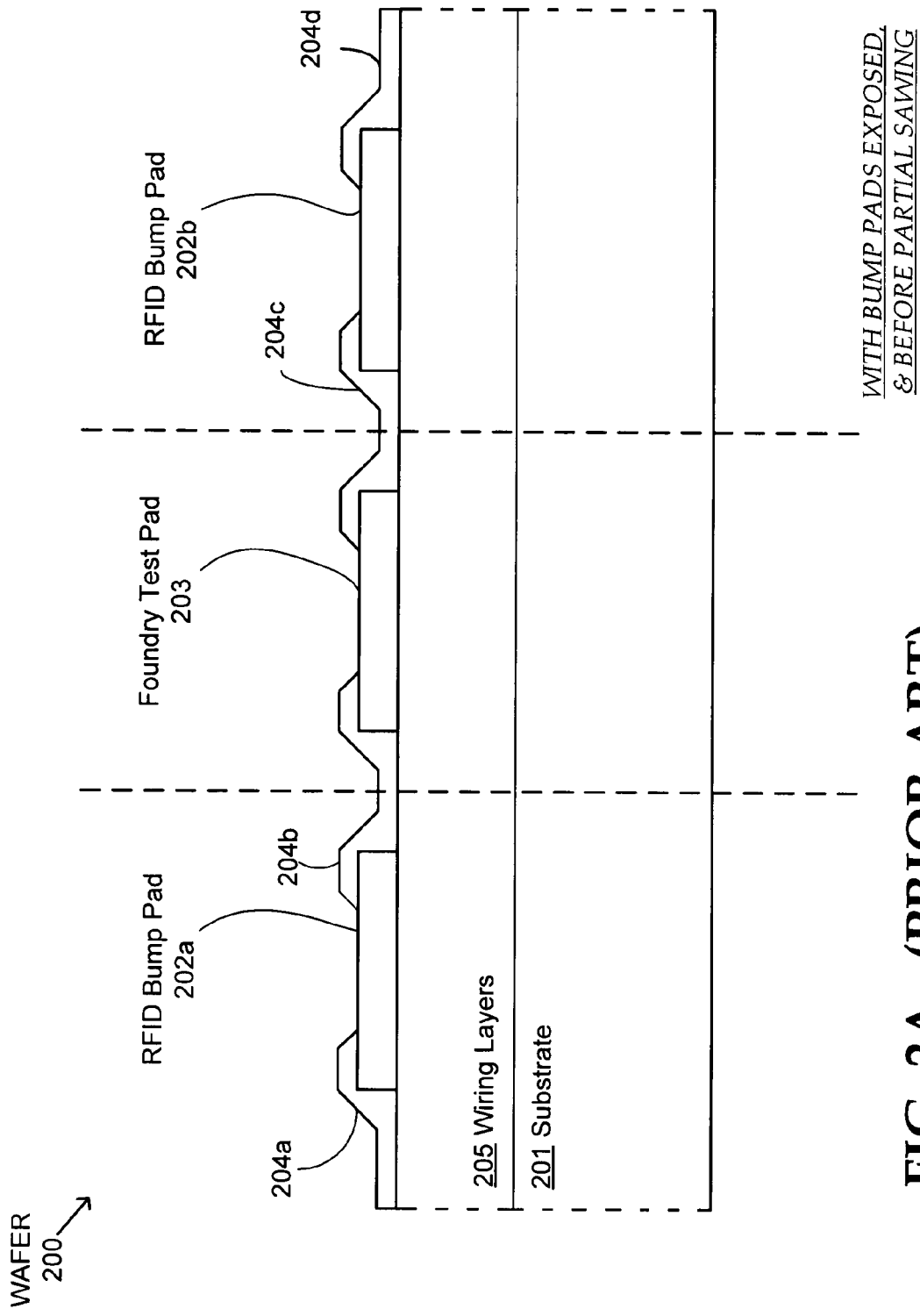
FIG. 2A (prior art) shows a plurality of RFID tag circuit die formed on a wafer such as the wafer of FIG. 1, whose bump pads are exposed.
Figure 2B:
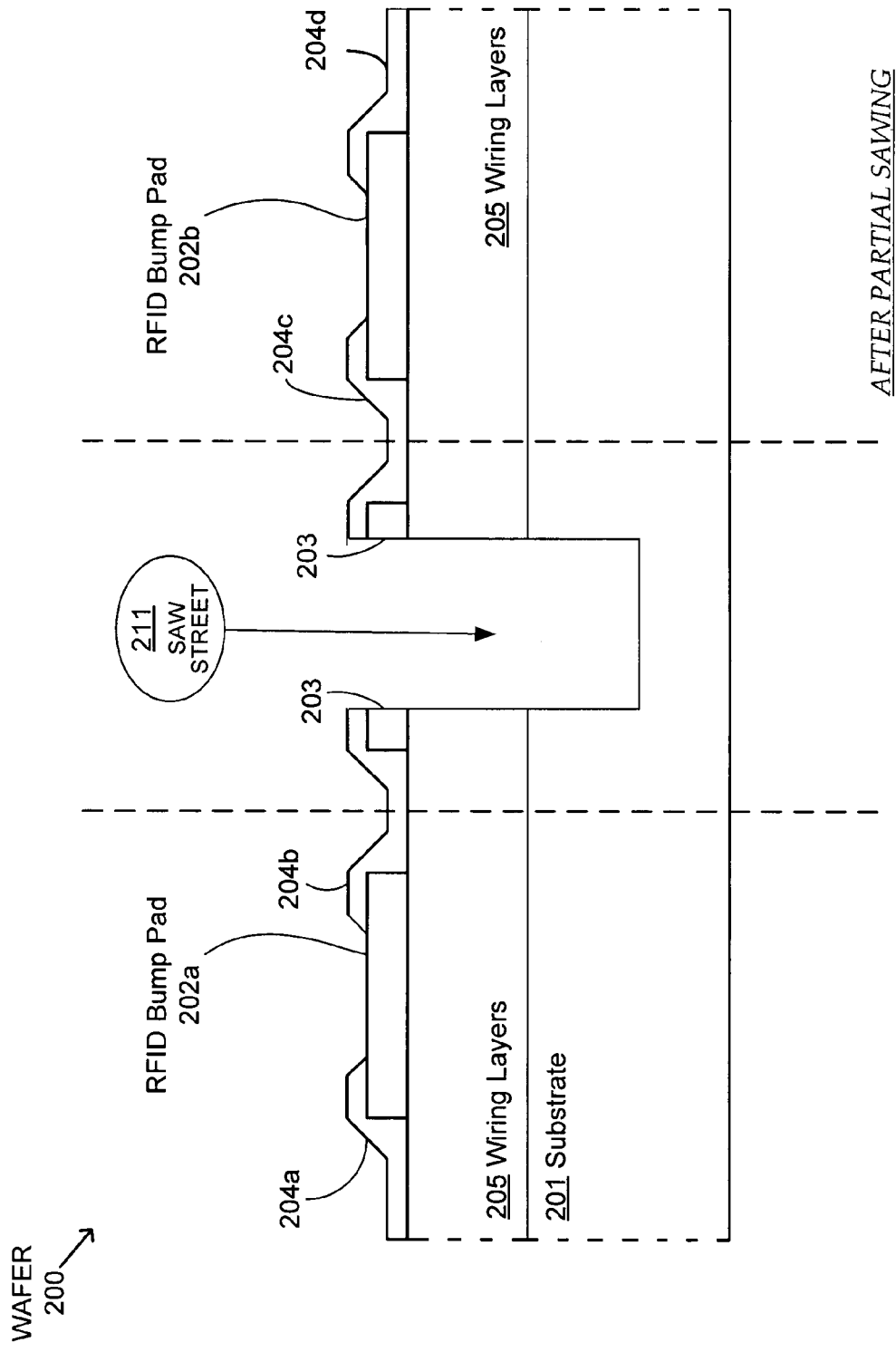
FIG. 2B (prior art) shows the wafer of FIG. 2A after it has been partially sawed according to a conventional process.
Figure 2C:
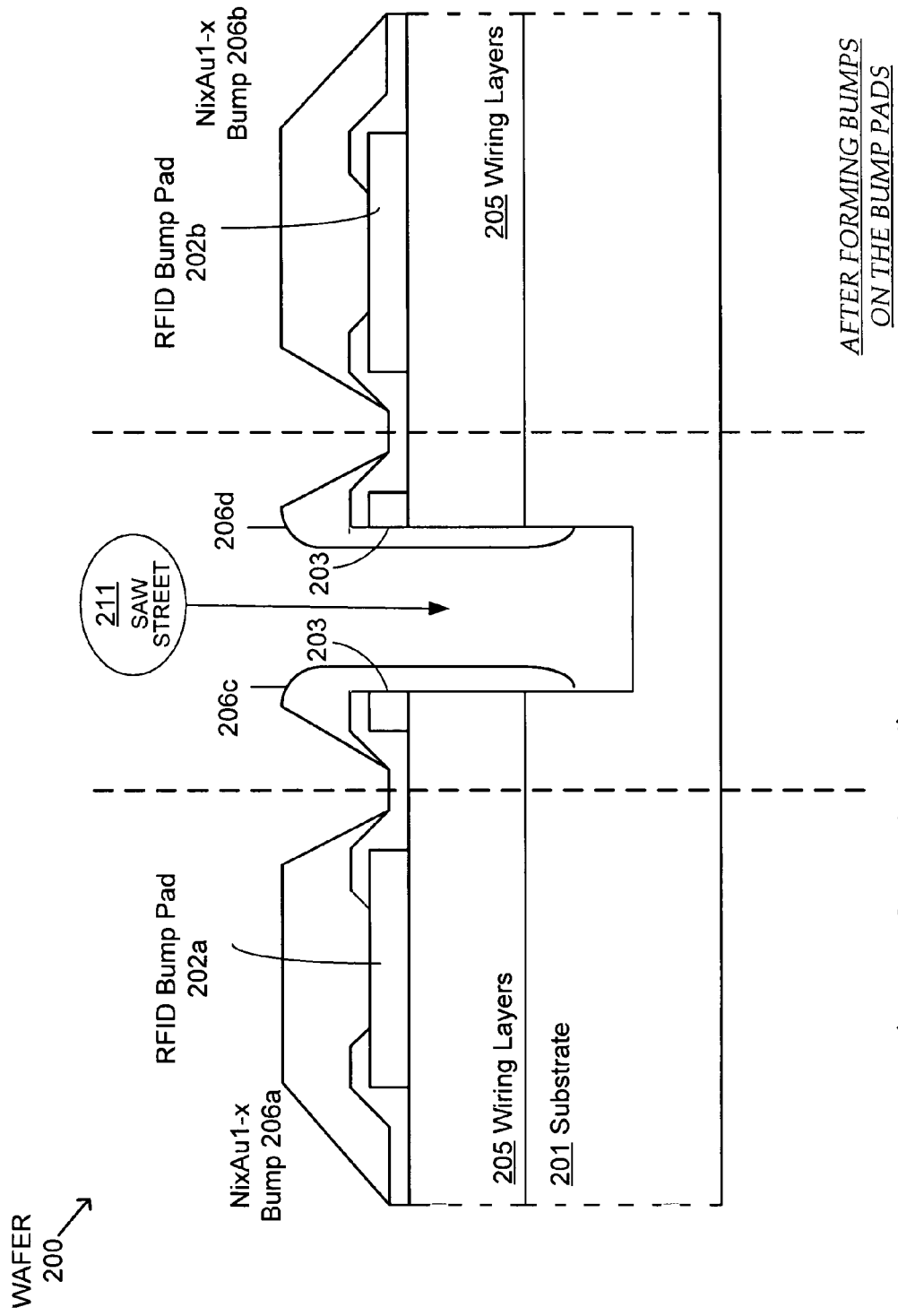
FIG. 2C (prior art) shows the wafer of FIG. 2B after $Ni_x$-$Au_{x-1}$ bumps have been formed on the exposed bump pads according to a conventional process.
Figure 2D:
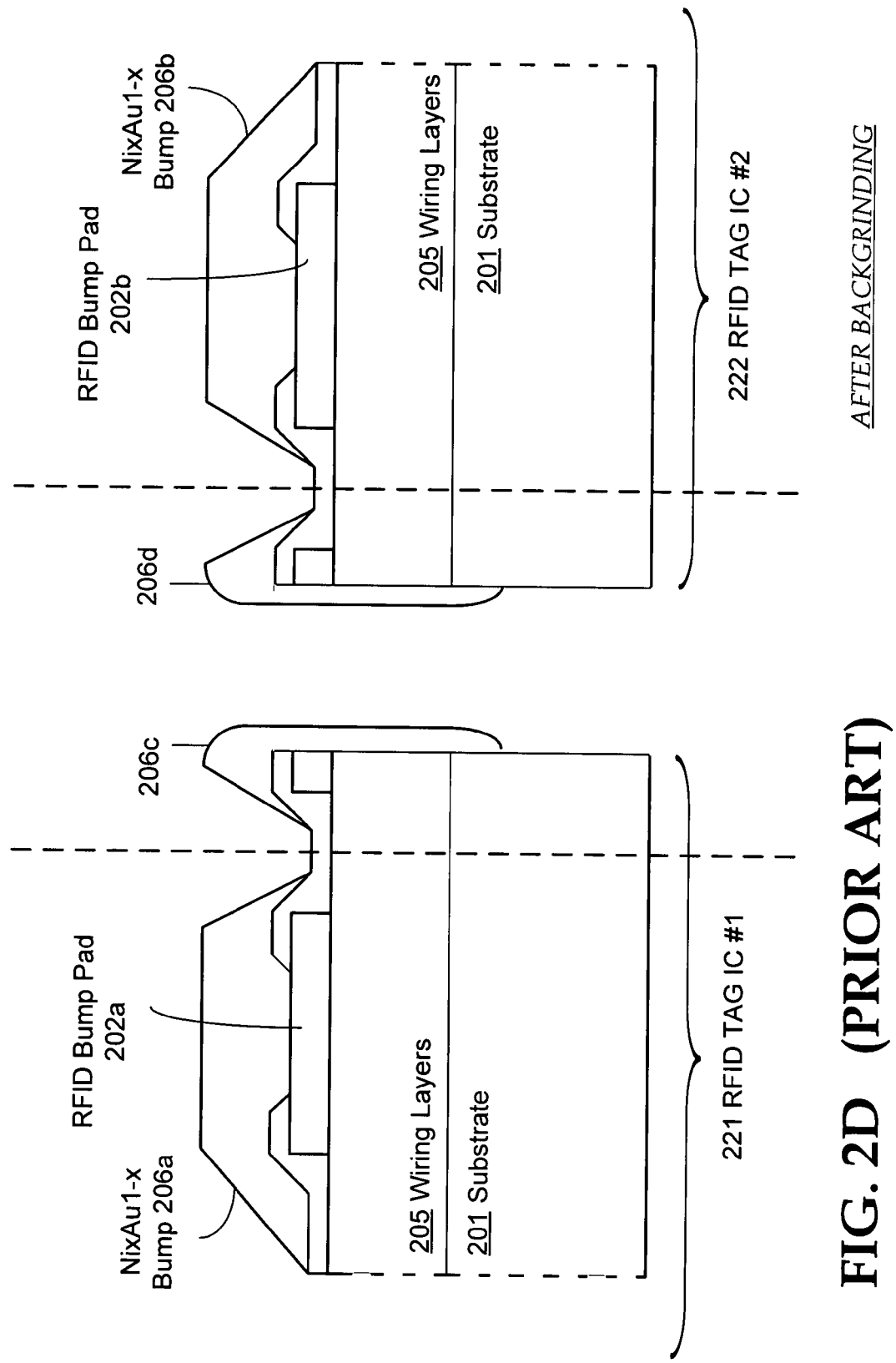
FIG. 2D (prior art) shows separate circuit die resulting after backgrinding the wafer of FIG. 2C according to a conventional process.
Figure 4A:
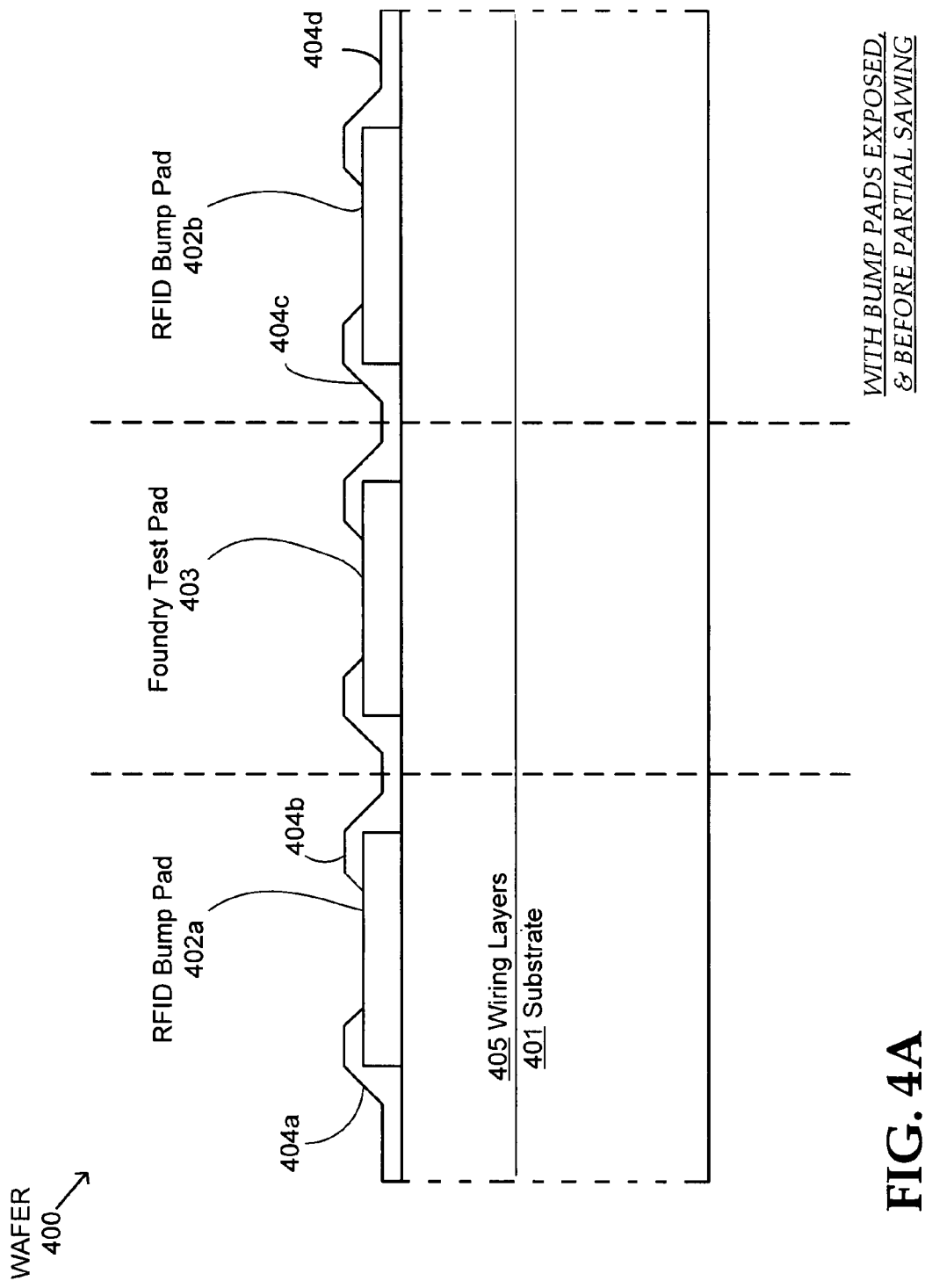
FIG. 4A shows a plurality of RFID tag circuit die formed on wafer such as the wafer of FIG. 1, whose bump pads are exposed.
Figure 4B:
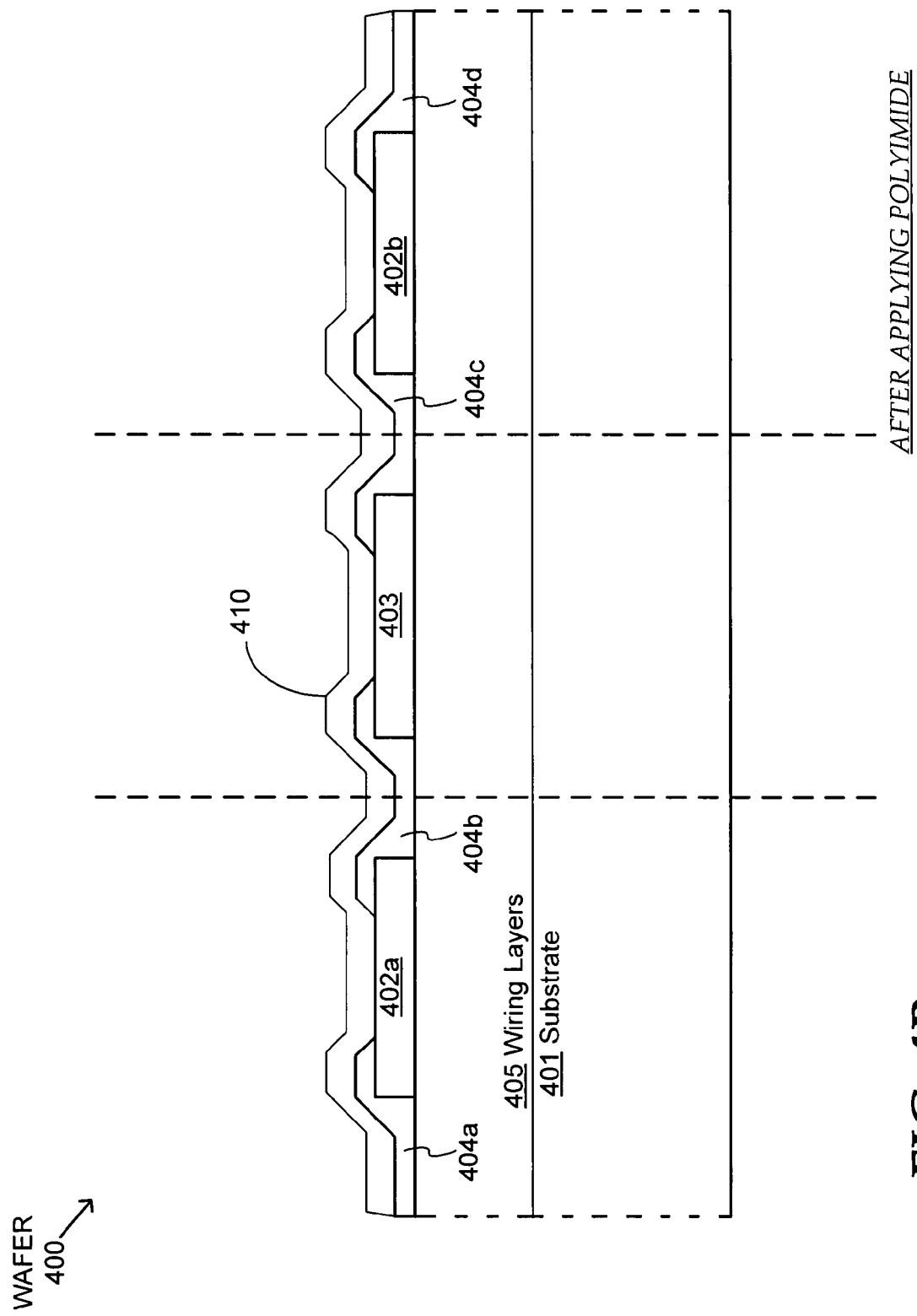
FIG. 4B shows the wafer of FIG. 4A after a layer of polyimide (410) has been formed on the wafer.

FIGS. 3, 4A through 4G and the following discussion demonstrate an improvement over the prior art. FIG. 4A, like FIG. 2A, shows the wafer having a layer of passivation 404a, 404b, 404c, 404d through which bump pads 402a, 402b and test pad 403 are exposed. However, instead of immediately beginning to separate the wafer into die (as seen in FIG. 2B), another layer 410 is deposited 301 over the wafer as seen in FIG. 4B. This layer is referred to as a shielding layer because, as will be described below, it shields the wafer test pads from the bump deposition solution thereby preventing the formation of unwanted bump material on the wafer surface.

According to one embodiment, the shielding layer 410 is made substantially of polyimide. According to another embodiment, the shielding layer 410 is a second layer of passivation. Processing details concerning these layers are provided in more detail below. After shielding layer 410 is deposited over the wafer, it is patterned 302 so as to expose the bump pads 402a, 402b but not the test pad 403. The resulting structure is observed in FIG. 4C.

The patterning may be performed by traditional lithography techniques where a layer of photo-resist is coated over shielding layer 410 and then electromagnetic radiation is directed through a mask onto the photoresist.

The patterns on the mask are such that the radiation shines on the regions of the photoresist over the bump pads 402a, 402b but does not shine over the regions of the photoresist over the test pads 403 (if the photoresist is of a first polarity), or, the patterns on the mask are such that the radiation shines on the regions of the photoresist over the test pads 403 but does not shine over the regions of the photoresist over the bump pads 402a, 402b (if the photoresist is of a second polarity). Alternatively, certain types of polyimides can be exposed directly with radiation (i.e., without a layer photoresist).

Importantly, wafer level testing where test signals are applied and/or received through test pads such as test pad 403 are performed before shielding layer 410 is deposited on the wafer. So, for example, a standard processing flow might entail the following sequence: 1) process the wafer up to the structure of FIG. 4A; 2) perform wafer level testing by applying wafer test probes to test pads such as test pad 403; 3) deposit shielding layer 410 to form the structure of FIG. 4B on a tested wafer; 4) pattern shielding layer 410 to form the structure of FIG. 4C.

Figure 4C:
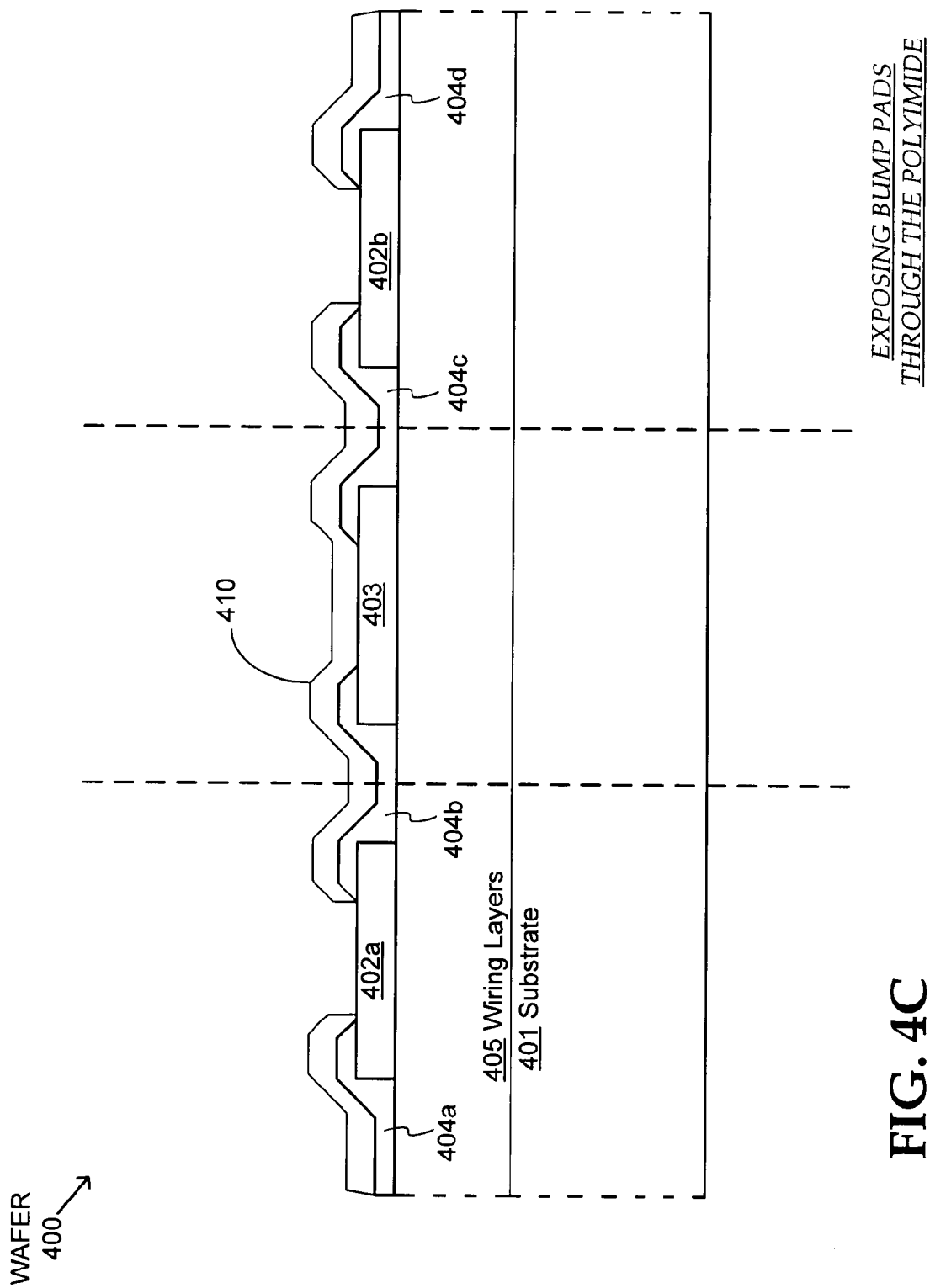
FIG. 4C shows the wafer of FIG. 4B after the polyimide layer has been etched above the bump pads (402a,b), but not over the wafer test cite pads (403)
Figure 4D:
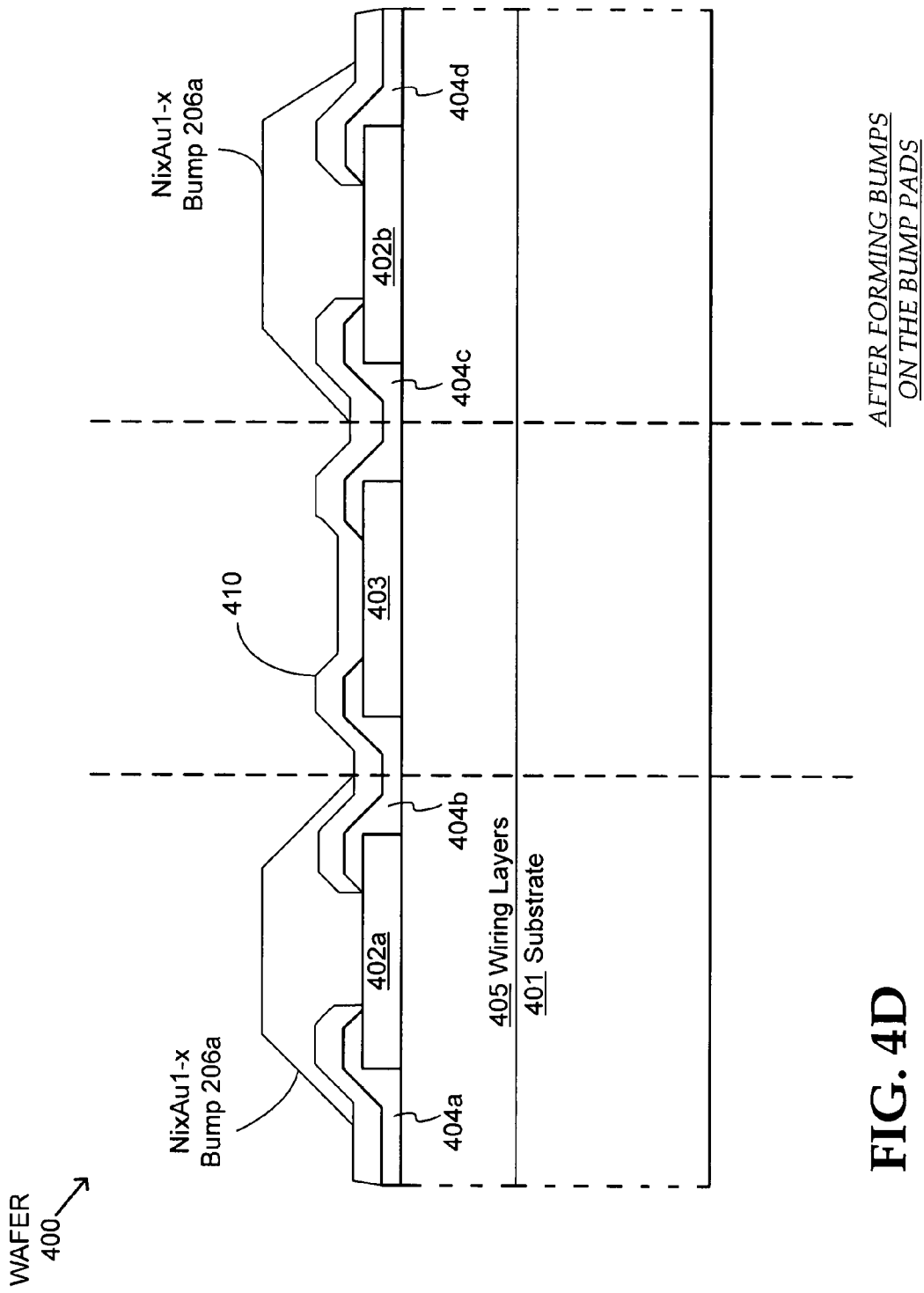
FIG. 4D shows the wafer of FIG. 4C after $Ni_xAu_{x-1}$ bumps have been formed on the exposed bump pads.
Figure 4E:
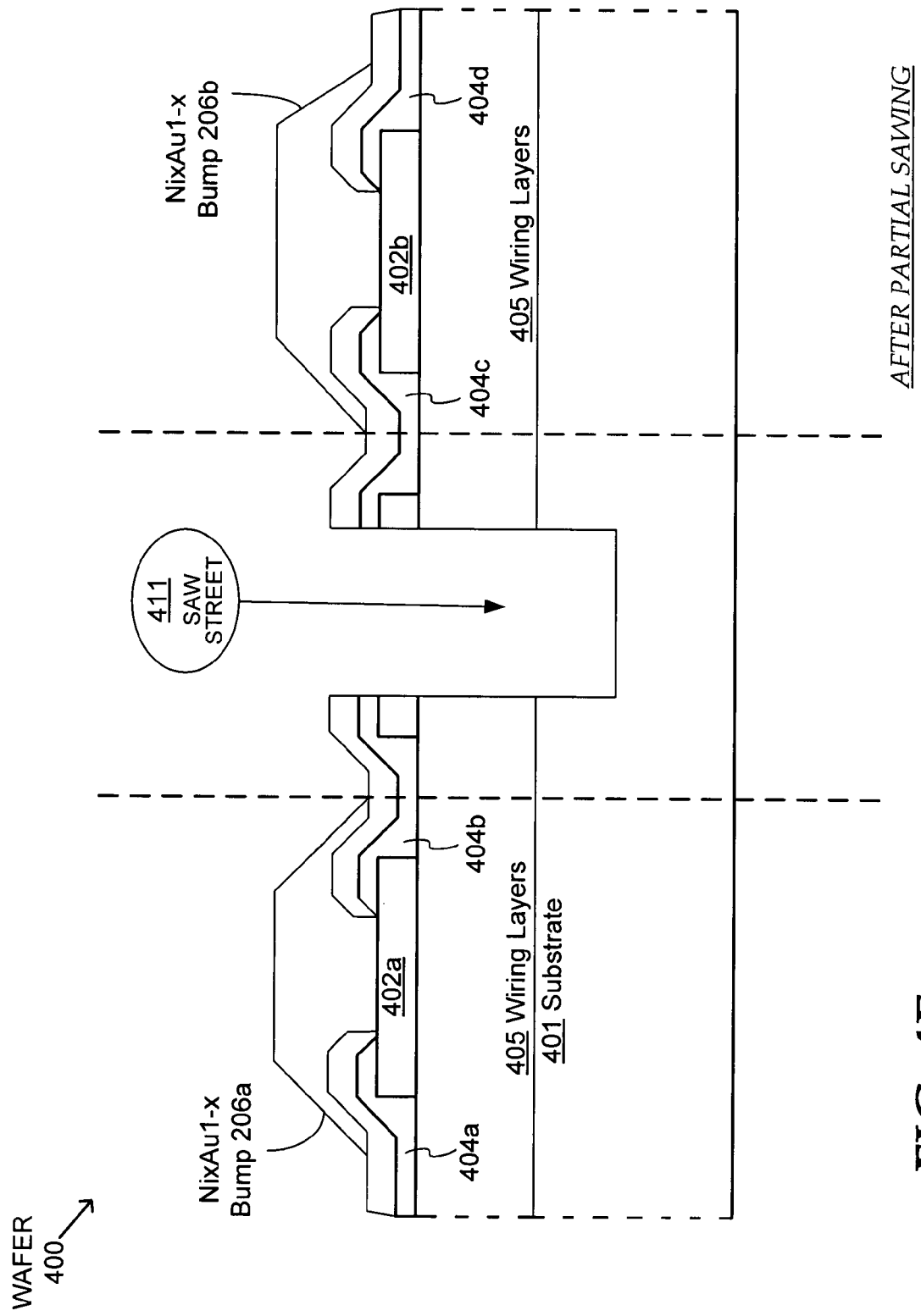
FIG. 4E shows the wafer of FIG. 4D after it has been partially sawed.

Starting then with the structure of FIG. 4C, contact bumps 206a, 206b are deposited 303 on the exposed bump pads 402a, 402b, for example, by any of a number of plating processes as described above in the Background. Importantly, because the test pad 403 is not exposed, it cannot act as a catalyst for depositing unwanted bump material as described in the Background. Thus, the result of the plating process is properly formed bump material substantially limited to the desired bumps residing on the bump pads.

After the bumps 206a, 206b are formed, the wafer is separated into individual die. Thus, as observed in FIG. 4E, the wafer is cut along the saw street 411. Here, polyimide and/or passivation is a somewhat "hard" material. Hence, according to one perspective, in order to minimize wafer saw blade wear-out, the thickness of shielding layer 410 should be kept minimal (e.g., approximately within a range of 2-6 μm inclusive). However, as described in more detail below, certain ancillary or additional advantages besides elimination of unwanted bump material may result. Because some of these advantages are better realized with a greater thickness for shielding layer 410, the ultimate thickness for shielding layer 410 depends on weighing the various advantages described below.

Figure 2E:
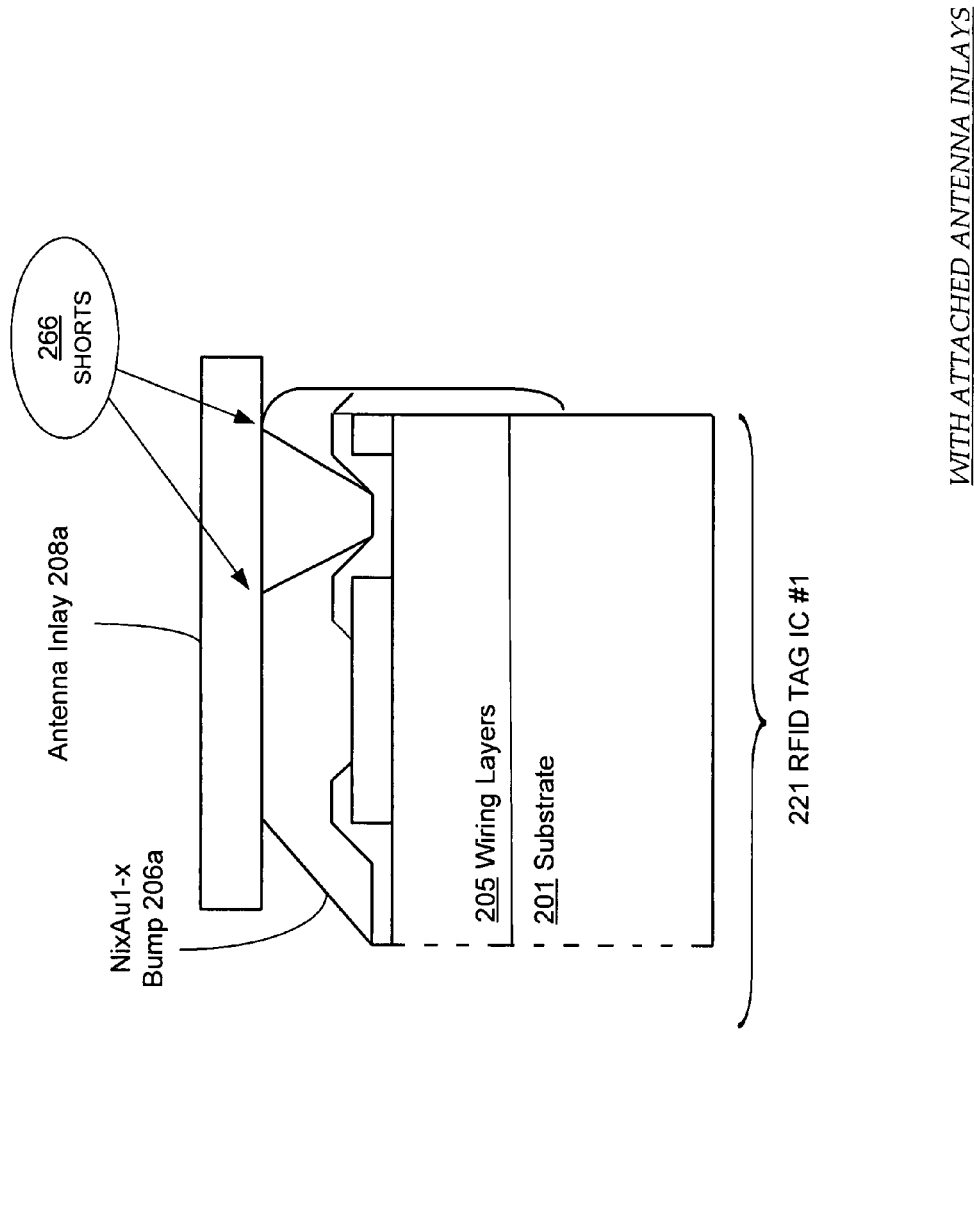
FIG. 2E (prior art) shows the circuit die of FIG. 2D after antenna inlays have been attached to their respective bumps according to a conventional process.
Figure 3:
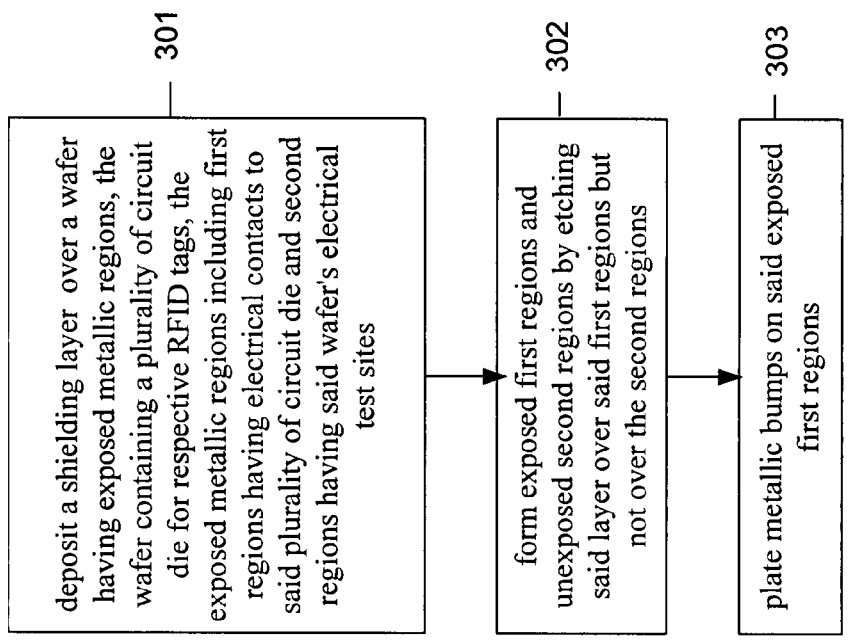
FIG. 3 shows flow charts for describing improved methodologies of forming RFID tag circuit I/O bumps according to embodiments.
Figure 4F:
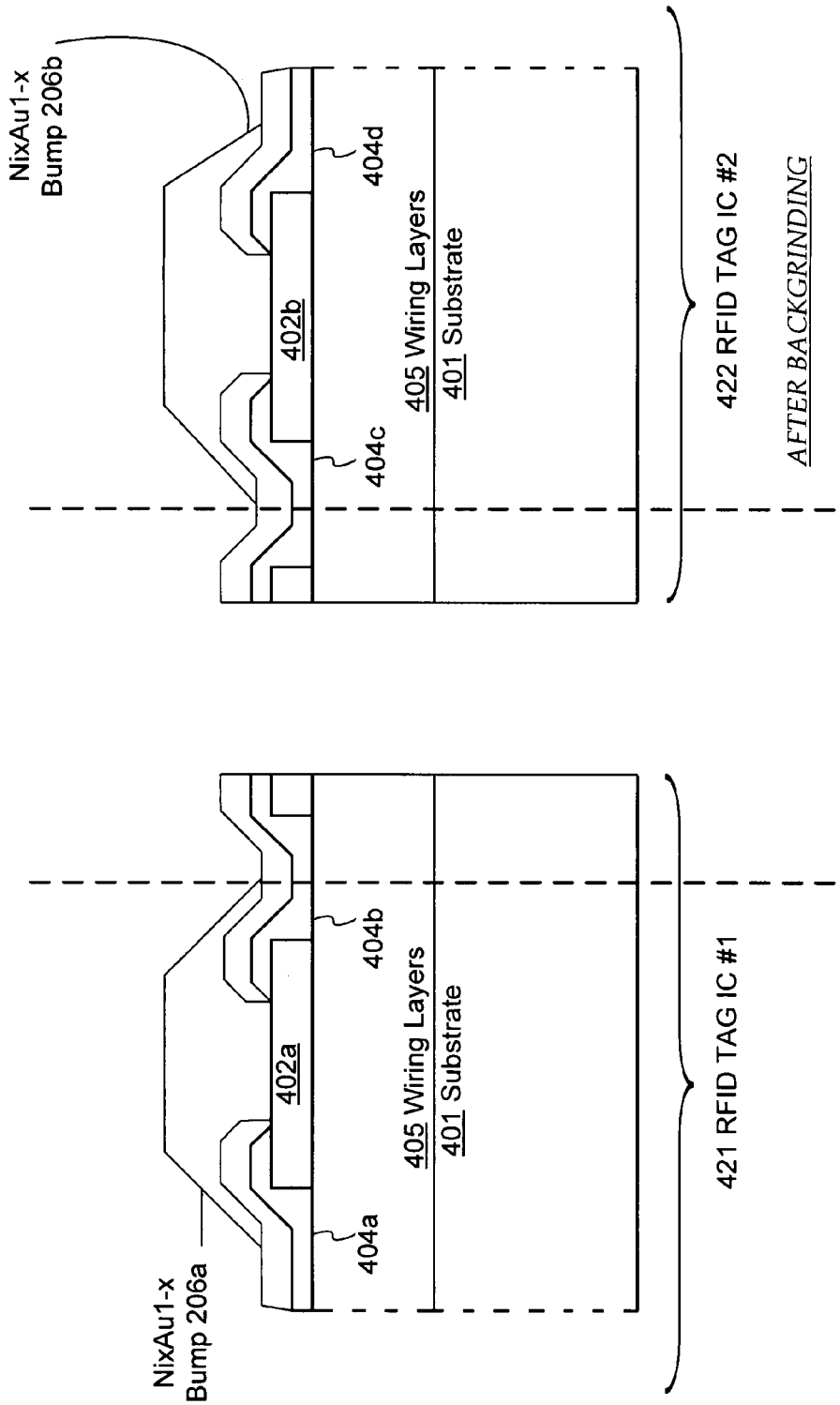
FIG. 4F shows the wafer of FIG. 4E after it has been back grinded to form separate circuit die.
Figure 4G:
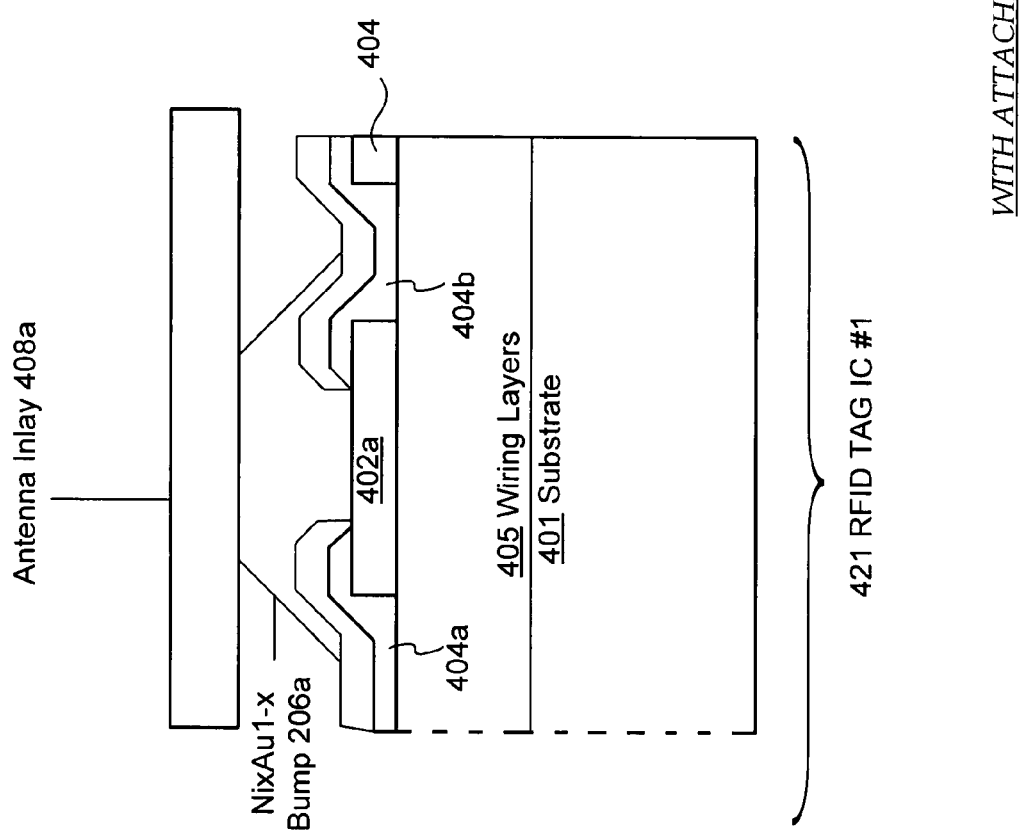
FIG. 4G shows the circuit die of FIG. 4F after antenna inlays have been attached to their respective bumps.

FIG. 4F shows the separation of the wafer into individual die through back grinding. Again, alternate separation techniques can be used (such as sawing straight through the wafer). FIG. 4G shows the antenna inlay 408a attached to the separated die. Note that, unlike the depiction of FIG. 2E, unwanted bump material is not in contact with the antenna inlay 408a. A discussion of some possible features of shielding layer 410 follows immediately below.

As discussed above, shielding layer 410 can be formed at least with polyimide or a second layer of passivation. A shielding layer 410 made of polyimide may be easily applied via standard spin-on or deposition techniques. The polyimide layer may be non-soluble, non-conductive as well as resistant to mechanical and thermal stresses. An exemplary polyimide includes Kapton® made by DuPont®. Shielding layer 410 can also be implemented as a second passivation shielding layer 410. Passivation is typically implemented as $Si_3N_4$ or other materials such as silicon oxynitride or doped glasses. Immediately following is a discussion of some additional or ancillary advantages of the shielding layer 410 that may affect some of the characteristics and/or processing parameters discussed just above.

One such ancillary advantage is the reduction of light sensitivity effects. RFID tag circuit die are essentially weak signal devices. That is, the electrical signal produced by the antenna is not a particularly strong signal. Silicon exhibits some photo-sensitivity, thus, electrical currents are produced in a RFID tag circuit die when light is shined on the die. Because of the relatively weak signals that an RFID tag circuit die typically processes, the presence of light can interfere with the electrical signaling and therefore interfere with the proper operation of the RFID tag.

Within the visible and Ultra Violet (UV) spectra at wavelength below 550 nm, a layer of polyimide tends to absorb light rather than transparently permit the light to flow through it. The absorption, in turn, reduces the intensity of light that reaches the semiconductor wafer. Thus, shielding layer 410 can be used to diminish the photosensitivity issues associated with RFID tag circuit die at least at wavelengths below 550 nm. Conceivably the polyimide could be darkened (e.g., painted black) to enhance the spectrum over which it exhibits absorptive behavior.

Another possible advantage is the role of shielding layer 410 as a mechanical stress buffer. Semiconductor ICs, when packaged, are subjected to a process in which epoxy resin is heated and molded around the IC. The thermal expansion of the resin places mechanical stress on the die which can result in its cracking or warping. Therefore, using a shielding layer that is pliable or compressible should absorb some of the stress that would otherwise be applied to the die during packaging. Also, when the antenna inlay is attached to the die, an epoxy resin is used that must be cured with high temperatures. Again, a layer of polyimide can protect the die against any resulting mechanical stresses by absorbing the expansion of the epoxy. Furthermore, polyimide can also promote adhesion to resin thus resulting in better adhesion between the die and the antenna inlay.

Also, additional non-thermally induced mechanical stresses can be applied to a die during its packaging. Shielding layer 410 can protect against chipping or cracking of the die resulting from the application of such mechanical stresses. For instance, according to various packaging processes, individual die are attached to backing tape on their wafer substrate side before they are packaged into individual packages. In order to remove the die from the backing tape a blunt pin is forcibly protruded through the backing tape upon the wafer substrate side of the die (e.g., to "pop" the die off the backing tape). The force of this trauma can cause chipping or cracking of the die. However, a polyimide shielding layer 410 can act as a sealant or other protective coating that prevents the die from being damaged in this manner. Conceivably, if the shielding layer 410 is hard enough, the tape can be applied to the surface of the die rather than the backside because the hard shielding layer can withstand the blunt pin force applied to the metallization surface of the die.

If the die is placed with the top of the die (surface with polyimide) on the tape, then the polyimide may also act as a soft buffer to absorb some of the trauma associated with removing the die from the tape. An example of a process that results in the die having its front attached to the tape is as follows. One possible process is for the saw operation to only partially go through the topside of the wafer. Then the wafer is transferred to another frame with tape face down (die top attached to the tape). The wafer is then back ground. According to a back grinding process, the exposed bottom of the die/substrate is ground or polished (material removed). When the back grind operation removes enough material to reach the bottom of the saw street, the die are singulated. This process results in separated die on tape with the "top" side attached to the tape. This process might be advantageous to manufacturing since the machine that attaches to the die during the removal from tape process can then immediately place the die on a tag with the bumps down (as needed to make electrical contact to the antenna.

Another possible benefit is the reduction of parasitic capacitance associated with the antenna assembly including the antenna inlay. Essentially, a polyimide layer having a dielectric constant less than 3.9 (e.g., within a range of 3.0 to 3.8 inclusive) can be readily deposited. Without the presence of shielding layer 410, the volume consumed by shielding layer 410 will include passivation or other material having a higher dielectric constant (e.g., $SiO2$ at 3.9 or $Si3N4$ at 7.5). Capacitance is proportional to dielectric constant, thus, lower dielectric constant materials between the antenna inlay and the die should result in lower parasitic capacitances between the inlay and die. These in turn can provide greater tolerance of inlay/bump misalignment and tighter impedance tolerances.

In the above, the order of operations is not constrained to what is shown, and different orders may be possible. In addition, actions within each operation can be modified, deleted, or new ones added without departing from the scope and spirit of the invention.

The electrical circuit(s) described in this document can be manufactured in any number of ways, as will be appreciated by the persons skilled in the art. One such way is as integrated circuit(s), as described below.

Schematic-type inputs can be provided for the purpose of preparing one or more layouts. These inputs can include as little as a schematic of a circuit, to more including relative sizes of circuit components and the like, as will be appreciated by a person skilled in the art for such inputs. These inputs can be provided in any suitable way, such as merely in writing, or electronically, as computer files and the like. Some of these computer files can be prepared with the assistance of suitable design tools. Such tools often include instrumentalities for simulating circuit behaviors and the like.

These inputs can be provided to a person skilled in the art of preparing layouts. This, whether the person is within the same company, or another company, such as under a contract.

A layout can be prepared that embodies the schematic-type inputs by the person skilled in the art. The layout is itself preferably prepared as a computer file. It may be additionally checked for errors, modified as needed, and so on.

In the above, computer files can be made from portions of computer files. For example, suitable individual designs can be assembled for the electrical components and circuits indicated in the schematic-type inputs. The individual designs can be generated anew, or selected from existing libraries. In the layout phase, the assembled designs can be arranged to interoperate, so as to implement as integrated circuit(s) the electrical circuit(s) of the provided schematic-type inputs. These computer files can be stored in storage media, such as memories, whether portable or not, and the like.

Then a special type of computer file can be synthesized from the prepared layout, in a manner that incorporates the prepared layout, which has the embodied schematic-type inputs. Such files are known in the industry as IC chip design files or tapeout files, and express instructions for machinery as to how to process a semiconductor wafer, so as to generate an integrated circuit that is arranged as in the incorporated layout.

The synthesized tapeout file is then transferred to a semiconductor manufacturing plant, which is also known as a foundry, and so on. Transferring can be by any suitable means, such as over an electronic network. Or a tapeout file can be recorded in a storage medium, which in turn is physically shipped to the mask manufacturer.

The received tapeout file is then used by mask making machinery as instructions for processing a semiconductor wafer. The wafer, as thus processed, now has one or more integrated circuits, each made according to the layout incorporated in the tapeout file. If more than one, then the wafer can be diced to separate them, and so on.

In this description, numerous details have been set forth in order to provide a thorough understanding. In other instances, well-known features have not been described in detail in order to not obscure unnecessarily the description.

A person skilled in the art will be able to practice the present invention in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and subcombinations of elements, features, steps, and/or functions, which are regarded as novel and non-obvious. Additional claims for other combinations and subcombinations may be presented in this or a related document.

What is claimed is:

1. A method, comprising:
    depositing a passivation layer over a wafer, said wafer containing a plurality of circuit die for respective RFID tags;
    etching said passivation layer to expose metallic regions, said exposed metallic regions including first regions electrically connected to said plurality of circuit die and second regions not electrically connected to said plurality of circuit die;
    depositing a shielding layer over said wafer above said passivation layer;
    forming exposed first regions and unexposed second regions by etching said shielding layer over said first regions but not over said second regions; and,
    depositing metallic bumps on said exposed first regions.

2. The method of claim 1 wherein said shielding layer is a polyimide layer.

3. The method of claim 2 further comprising attaching, to at least one circuit die from amongst said plurality of circuit die, an RFID tag antenna's associated electrical contacts to said at least one circuit's metallic bumps.

4. The method of claim 3 wherein said attaching includes applying epoxy between said RFID tag's antenna and said polyimide layer.

5. The method of claim 2 further comprising after said depositing but before said etching:
    depositing a layer of photoresist over said polyimide layer;
    irradiating said photoresist layer through a mask to create irradiated and non-irradiated regions of said photoresist layer, wherein said irradiated regions are aligned over one of:
    said first regions;
    said second regions.

6. The method of claim 2 further comprising after said depositing but before said etching:
    irradiating said polyimide layer through a mask to create irradiated and non-irradiated regions of said photoresist layer, wherein said irradiated regions are aligned over one of:
    said first regions;
    said second regions.

7. The method of claim 2 wherein said metallic bumps are substantially comprised of one of the following:
    a) Ni and Au;
    b) Au;
    c) Pd
    d) solder.

8. The method of claim 2 further comprising separating individual circuit die from said wafer by:
    sawing partially through said wafer at said unexposed second regions;
    grinding said wafer at said wafer's opposite side.

9. The method of claim 2 further comprising removing a circuit die cut from said wafer from backing tape by impinging an assembly pin through said backing tape and onto said circuit die's backside or topside.

10. The method of claim 1 wherein said shielding layer is a second passivation layer.

11. The method of claim 10 further comprising attaching, to at least one circuit die from amongst said plurality of circuit die, an RFID tag antenna's associated electrical contacts to said at least one circuit's metallic bumps.

12. The method of claim 11 wherein said attaching includes applying epoxy between said RFID tag's antenna and said shielding layer.

13. The method of claim 10 further comprising after said depositing but before said etching:
    depositing a layer of photoresist over said second passivation layer;
    irradiating said photoresist layer through a mask to create irradiated and non-irradiated regions of said photoresist layer, wherein said irradiated regions are aligned over one of:
    said first regions;
    said second regions.

14. The method of claim 10 wherein said metallic bumps are substantially comprised of one of the following:
    a) Ni and Au;

b) Au;
c) Pd
d) solder.

15. The method of claim 10 further comprising separating individual circuit die from said wafer by:
dicing partially through said wafer at said unexposed second regions;
grinding said wafer at said wafer's opposite side.

16. The method of claim 10 further comprising removing a circuit die cut from said wafer from backing tape by impinging an assembly pin through said backing tape and onto said circuit die's backside or topside.

17. A method, comprising:
depositing a shielding layer over a wafer having exposed metallic regions, said wafer containing a plurality of circuit die for respective RFID tags, said wafer having exposed metallic regions, said exposed metallic regions including first regions having electrical contacts to said plurality of circuit die and second regions in electrical contact with said wafer's test sites;
forming exposed first regions and unexposed second regions by etching said shielding layer over said first regions but not over said second regions; and,
depositing metallic bumps on said exposed first regions.

18. The method of claim 17 wherein said shielding layer is a polyimide layer.

19. The method of claim 18 further comprising attaching, to at least one circuit die from amongst said plurality of circuit die, an RFID tag antenna's associated electrical contacts to said at least one circuit's metallic bumps.

20. The method of claim 19 wherein said attaching includes applying epoxy between said RFID tag's antenna and said polyimide layer.

21. The method of claim 18 further comprising after said depositing but before said etching:
depositing a layer of photoresist over said polyimide layer;
irradiating said photoresist layer through a mask to create irradiated and non-irradiated regions of said photoresist layer, wherein said irradiated regions are aligned over one of:
said first regions;
said second regions.

22. The method of claim 18 further comprising after said depositing but before said etching:
irradiating said polyimide layer through a mask to create irradiated and non-irradiated regions of said photoresist layer, wherein said irradiated regions are aligned over one of:
said first regions;
said second regions.

23. The method of claim 18 wherein said metallic bumps are substantially comprised of one of the following:
a) Ni and Au;
b) Au;
c) Pd
d) solder.

24. The method of claim 18 further comprising separating individual circuit die from said wafer by:
dicing partially through said wafer at said unexposed second regions;
grinding said wafer at said wafer's opposite side.

25. The method of claim 18 further comprising removing a circuit die cut from said wafer from backing tape by impinging an assembly pin through said backing tape and onto said circuit die's backside or topside.

26. The method of claim 17 wherein said shielding layer is a second passivation layer.

27. The method of claim 26 further comprising attaching, to at least one circuit die from amongst said plurality of circuit die, an RFID tag antenna's associated electrical contacts to said at least one circuit's metallic bumps.

28. The method of claim 27 wherein said attaching includes applying epoxy between said RFID tag's antenna and said polyimide layer.

29. The method of claim 26 further comprising after said depositing but before said etching:
depositing a layer of photoresist over said second passivation layer;
irradiating said photoresist layer through a mask to create irradiated and non-irradiated regions of said photoresist layer, wherein said irradiated regions are aligned over one of:
said first regions;
said second regions.

30. The method of claim 26 wherein said metallic bumps are substantially comprised of Ni and Au.

31. The method of claim 26 further comprising separating individual circuit die from said wafer by:
sawing partially through said wafer at said unexposed second regions;
grinding said wafer at said wafer's opposite side.

32. The method of claim 26 further comprising removing a circuit die cut from said wafer from backing tape by impinging an assembly pin through said backing tape and onto said circuit die's backside or topside.

* * * * *